United States Patent [19]

Brown

[11] Patent Number: 5,209,681
[45] Date of Patent: May 11, 1993

[54] ELECTRICAL CONTACT WITH THE ANTI-SOLDER WICKING TAB

[75] Inventor: Garry L. Brown, Kernersville, N.C.

[73] Assignee: AMP Incorporated, Harrisburg, Pa.

[21] Appl. No.: 858,192

[22] Filed: Mar. 26, 1992

[51] Int. Cl.$^5$ .................................................. H01R 4/02
[52] U.S. Cl. ........................................ 439/876; 439/83
[58] Field of Search .......................... 439/83, 879, 876

[56] References Cited

U.S. PATENT DOCUMENTS

| | | | |
|---|---|---|---|
| 2,385,915 | 10/1945 | Hagedorn et al. | 439/874 X |
| 2,689,337 | 9/1954 | Burtt et al. | 439/874 X |
| 2,691,771 | 10/1954 | Burtt et al. | 439/874 X |

OTHER PUBLICATIONS

AMP Drawing Number 640661.

*Primary Examiner*—Eugene F. Desmond
*Attorney, Agent, or Firm*—Bruce J. Wolstoncroft

[57] ABSTRACT

An electrical contact has a tab provided in passage which extends through the contact. The tab is dimensioned to provide a barrier, past which solder cannot flow. Consequently, as the contact is mounted to a printed circuit board, the tab prevents the solder from wicking from the mounting portion to the mating portion.

11 Claims, 2 Drawing Sheets

ELECTRICAL CONTACT WITH THE ANTI-SOLDER WICKING TAB

FIELD OF THE INVENTION

The invention is directed to an electrical contact which has a mounting area for mounting to a substrate or the like. In particular, the electrical contact has anti-solder wicking tabs provided thereon which prevent the flow of solder to the mating area of the contact.

BACKGROUND OF THE INVENTION

It is common practice to mount an electrical connector having a plurality of contacts positioned therein to a printed circuit board. In order to ensure for a proper mechanical and electrical connection, mounting portions of the contacts are soldered to the printed circuit board. In the prior art, as the soldering process occurred, it was not uncommon for the solder to flow from the mounting portions of the contacts to the mating portions. This phenomenon, known as solder wicking, is unacceptable, as the solder interferes with the mating portions of the contacts and prevents a positive electrical connection from being effected between the electrical connector and a mating electrical connector.

The problem of solder wicking is magnified when the mounting portions of the contacts have a hollow configuration. During the soldering process, the contacts are exposed to an environment in which warm gases and the like are present. As the contacts are moved through the soldering station, the warm gases may be forced through the hollow contact, creating a vacuum-like effect. The vacuum in the hollow contact causes the solder to be pulled through the hollow mounting portions of the contacts and into the mating portions, thereby adversely effecting the mating portions.

SUMMARY OF THE INVENTION

The invention is directed to an electrical connector, and to the electrical terminals provided therein. Each terminal has means to prevent the flow of solder from a mounting portion, which cooperates with a substrate, to a mating portion, which cooperates with a mating connector. This ensures that the solder will only cooperate with the mounting portion of the contact, to properly secure the contact to the substrate. As the solder is prevented from flowing or wicking to the mating portion, the mating characteristics of the mating portion will not be adversely effected by the solder.

DETAILED DESCRIPTION OF THE INVENTION

Figure 1:
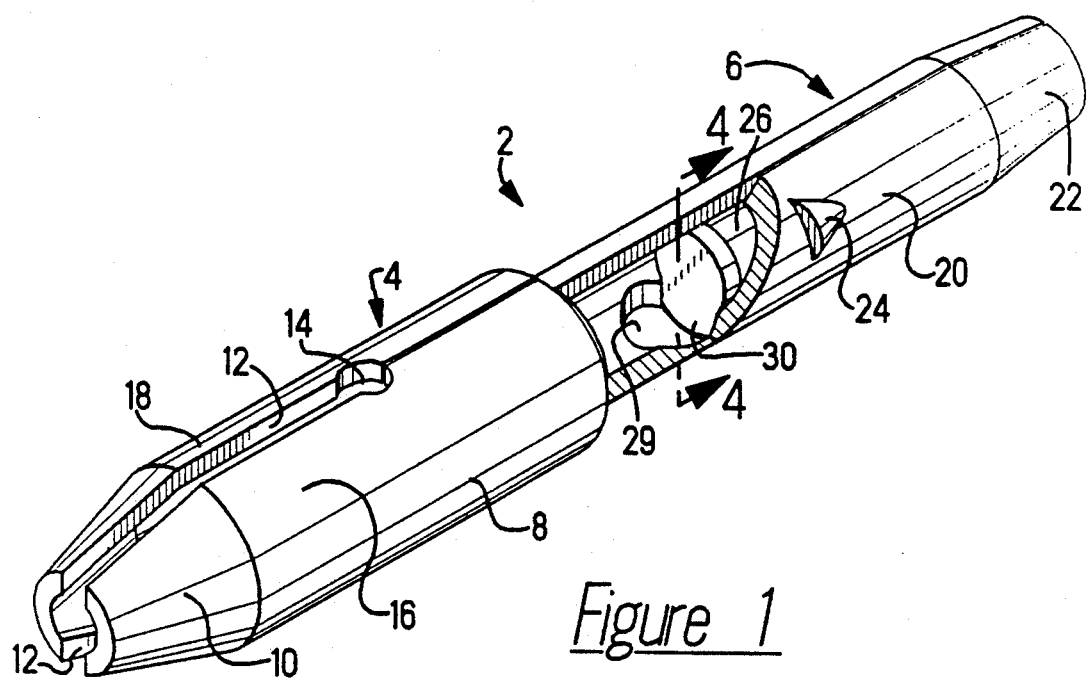
FIG. 1 is a perspective view of an electrical contact of the present invention, a portion of the contact has been sectioned to illustrate the anti-solder wicking tab provided therein.

A contact or terminal 2, as shown in FIG. 1, has a mating portion 4 and a mounting portion 6. The mating portion 4 has a body section 8 with a hollow cylindrical configuration. A tapered section 10 extends from an end of the body section 8. Opposed slots 12 extend from the body section 8 to an opening 14 provided at an end of the tapered section 10. The slots 12 have an increased dimension proximate an end thereof. The slots define a first contact leg 16 and a second contact leg 18 which extend from the body section 8 to the tapered section 10. The slots are positioned to allow the first and second contact legs to have resilient characteristics and to move relative to each other. The opening 14, provided at the end of the tapered section 10, is dimensioned to receive a mating pin (not shown) therein.

It is worth noting, that the configuration of the mating portion 2 can be as shown in FIG. 1, or can be of any other type of mating portion generally known in the industry.

The mounting portion 6 has a main section 20 which has a fixed end which is integral with the body section 8 of the mating portion 4. A lead-in section 22 extends from a free end of the main section 20. The main section 20 has a hollow cylindrical configuration, which has a smaller diameter than the diameter of the body section 8. An opening (not shown) is positioned at the end of the lead-in section 22.

Figure 2:
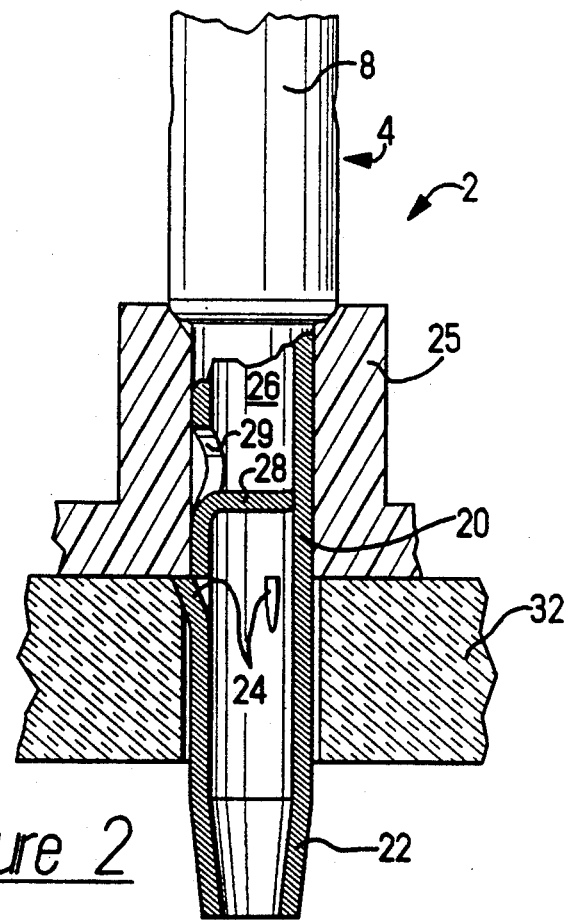
FIG. 2 is a partial cross-sectional view of the contact showing the anti-solder wicking tab in engagement with the wall of the contact.

Securing barbs 24 are positioned on the outside surface of the main section 20. The securing barbs 24, as best shown in FIG. 2, cooperate with a housing 25 when the contacts 2 are inserted into the housing.

The cylindrical body section 8 and the cylindrical main section 20 are hollow and form a passage 26 which extends the length of the contact. The openings provided at the end of the lead-in section and the tapered section provided access to the passage 26.

An anti-solder wicking tab 28 is positioned in the passage 26 of the mounting portion 6. The anti-solder wicking tab is stamped and formed from a portion of the wall of the main section 20 of the mounting portion 6, and is positioned to extend in a direction which is essentially perpendicular to the wall of the main section 20. An opening 29 is adjacent tab 28.

Figure 4:
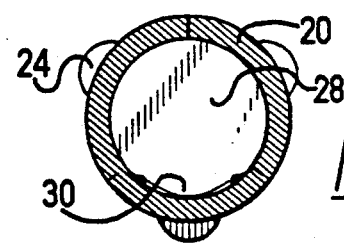
FIG. 4 is a cross-sectional view of the anti-solder wicking tab, taken along lines 4—4 of FIG. 1.

As best shown in FIG. 4, the tab 28 is stamped in an essentially circular configuration. A securing section or portion 30 of the tab remains integrally attached to the wall of the main section 20. The tab is dimensioned such that the tab 28 is provided in engagement with the inner wall of the mating portion 20 along the entire circumference of the tab. This ensures that the passage 26 will be completely blocked by the tab 28.

As is shown in FIG. 2, the cooperation of the inner wall of the mounting section and the tab 28 causes the tab 28 to be deformed within the passage 26. This deformation occurs because the tab is dimensioned to be slightly larger than the passage provided in the mounting portion 6. As the tab 28 is slightly larger than the passage, the entire circumference of the tab will cooperate with the inner walls of the main portion 20 to form a barrier which prevents the flow of material beyond the tab.

Figure 3:
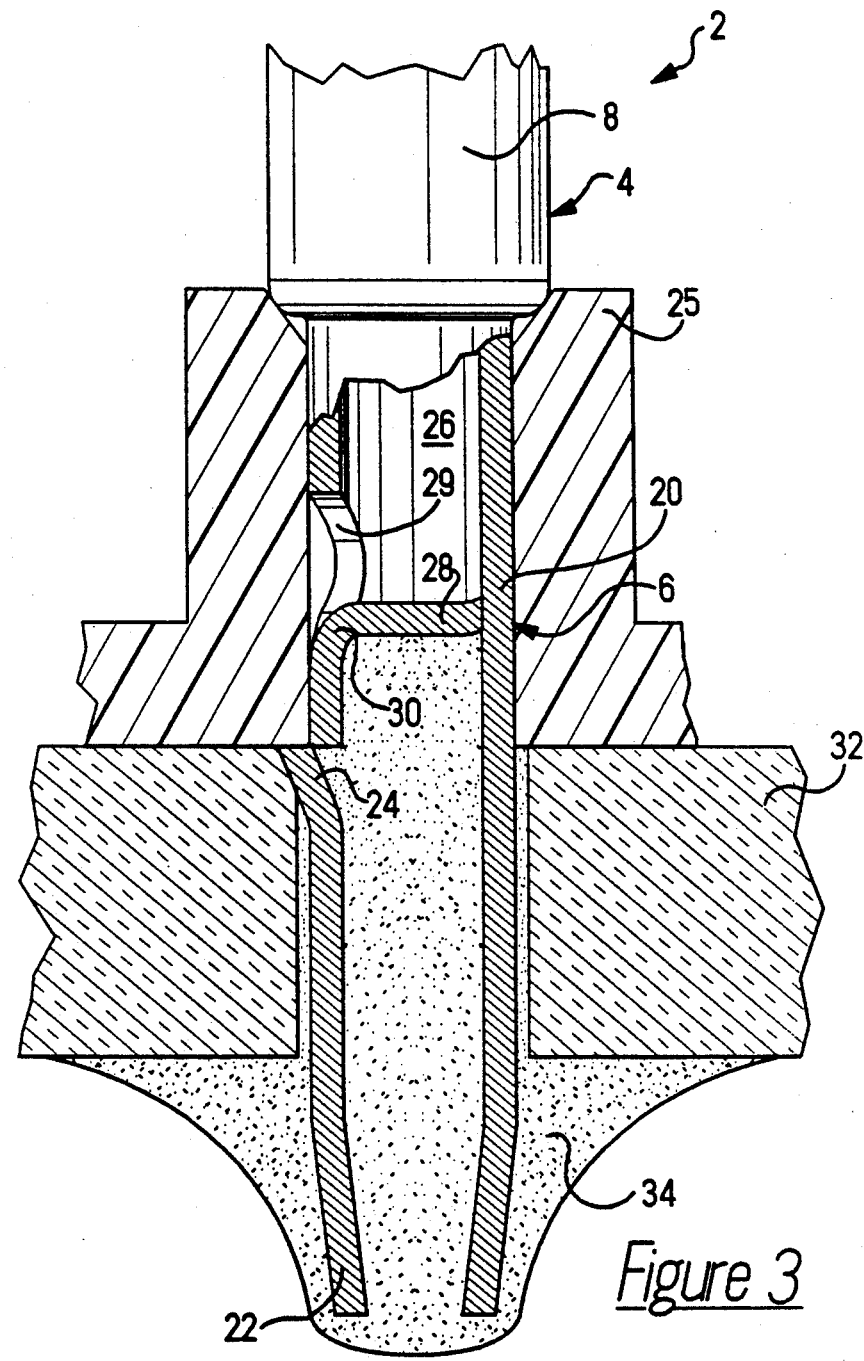
FIG. 3 is a partial cross-sectional view of the contact, similar to that of FIG. 2, showing how the solder flows in the contact.

In order to ensure that the tab is properly positioned, the tab is stamped and formed from the metal stock before the contact is formed. After the tab is formed, the mounting portion, including the hollow main section 20 is formed around the tab 28. This process is controlled such that the inner wall of the main section 20 will engage the entire circumference of the tab 28. In order to ensure that a tight fit is provided, the main section 20 is formed so that the diameter of the passage 26 is slightly less than the diameter of the tab 28. This results in the type of deformation of the tab which is illustrated in FIG. 3, which in turn results in an air tight connection between the tab and the inner wall.

With the contact properly stamped and formed, the contacts are positioned in a housing and are maintained therein by means of the securing barbs 24. The housing is then positioned on a printed circuit board 32 with the mounting portions 6 of the contacts 2 engaging conductive paths on the printed circuit board. In order to maintain the contacts in electrical and mechanical engagement with the conductive paths, solder 34 (FIG. 3) is applied to the mounting portions and conductive paths. The solder is then exposed to energy, by way of conventional means, which causes the solder to flow around the mounting portions 6 of the contacts. The energy is removed, and the solder hardens, thereby ensuring that the contacts and conductive paths will be maintained in engagement.

In the prior art contacts, when the solder was exposed to energy, the solder would flow through the hollow mounting portions of the contact to the mating portions, thereby causing the mating portions to become ineffective. However, in the contacts described herein, this problem is eliminated. The anti-solder wicking tabs 28 provide a barrier across which no solder can flow. Consequently, the mating portions 4 remain solder free.

As previously discussed, the dimensioning of the tab is important. The entire circumference of the anti-solder wicking tab 28 of the present invention is provided in engagement with the inner wall of the main portion 20 of the mounting portion 6 to form the barrier. If a portion of the circumference of the tab is spaced from the inner wall, a small channel is provided. This channel is significant because as the soldering process occurs, the gases will flow through the channel. As previously discussed, the flow of these gases can form a vacuum which will cause the solder to be pulled through the channel. It is worth noting that although the channel may be small, the force of the vacuum is great. Consequently, even if a small channel is provided between the tab and the inner wall, the flow of solder to the mating portion can be significant. However, the dimensioning of the tab 28 of the present invention eliminates this problem, as no channel is present.

Changes in construction will occur to those skilled in the art and various apparently different modifications and embodiments may be made without departing from the scope of the invention. The matter set forth in the foregoing description and accompanying drawings is offered by way of illustration only. It is therefore intended that the foregoing description be regarded as illustrative rather than limiting.

I claim:

1. An electrical terminal comprising:
    a mating portion and a mounting portion, the mounting portion has a passage which extends from proximate an end thereof toward the mating portion;
    a tab is provided in the mounting portion to completely block the passage, the tab is dimensioned to be slightly larger than the passage, such that as the tab is placed in engagement with the inner wall of the mounting portion, the tab will deform;
    whereby as the terminal has solder positioned on the mounting portion, the tab will prevent the solder from flowing through the passage from the mounting portion to the mating portion.

2. An electrical terminal as recited in claim 1 wherein the tab is stamped and formed from a wall of the mounting portion.

3. An electrical terminal as recited in claim 2 wherein a securing section of the tab remains integrally attached to the wall of the mounting portion.

4. An electrical terminal as recited in claim 1 wherein the tab extends in a direction which is essentially perpendicular to the inner wall of the mounting portion.

5. An electrical terminal as recited in claim 1 wherein the mounting portion has an essentially cylindrical configuration.

6. An electrical connector having a housing with contacts provided therein, the electrical connector comprising:
    terminals which extend in terminal receiving passages provided in the housing, the terminals have mounting portions which are configured to be soldered to a substrate, the terminals have passages provided therein which extend from free ends of the mounting portions;
    tabs are positioned in the passages of the terminals, the tabs cooperate with walls of the passages to provide barriers in the passages, the tabs are dimensioned to be slightly larger than the passages, such that as the tabs are placed in engagement with the walls of the passages, the tabs will deform;
    whereby as the electrical connector is soldered to the substrate, the tabs will prevent the flow of solder in the passages to positions beyond the tabs.

7. An electrical connector as recited in claim 6 wherein the tabs are positioned in the mounting portions.

8. An electrical connector as recited in claim 7 wherein the tabs are stamped and formed from walls of the mounting portions, thereby providing openings in the walls.

9. An electrical connector as recited in claim 8 wherein securing sections of the tabs remain integrally attached to the walls of the mounting sections.

10. An electrical connector as recited in claim 9 wherein the tabs extend in a direction which is essentially perpendicular to the walls of the mounting portions.

11. An electrical connector as recited in claim 6 wherein the mounting portions have an essentially cylindrical configuration.

* * * * *